(12) United States Patent
Yamada et al.

(10) Patent No.: US 8,746,309 B2
(45) Date of Patent: Jun. 10, 2014

(54) POSITION CONTROLLER FOR FLEXIBLE SUBSTRATE

(75) Inventors: Takanori Yamada, Tokyo (JP); Shoji Yokoyama, Hachiouji (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/381,051

(22) PCT Filed: Dec. 21, 2010

(86) PCT No.: PCT/JP2010/072987
§ 371 (c)(1), (2), (4) Date: Feb. 6, 2012

(87) PCT Pub. No.: WO2011/099227
PCT Pub. Date: Aug. 18, 2011

(65) Prior Publication Data
US 2012/0291958 A1 Nov. 22, 2012

(30) Foreign Application Priority Data

Feb. 9, 2010 (JP) ................................ 2010-026502
Jul. 20, 2010 (JP) ................................ 2010-162704

(51) Int. Cl.
*B32B 37/00* (2006.01)
*B29C 65/00* (2006.01)

(52) U.S. Cl.
CPC .................................. *B29C 66/95* (2013.01); *B29C 66/90* (2013.01)
USPC ............ 156/361; 156/538; 156/555; 156/582

(58) Field of Classification Search
USPC ................. 156/580, 361, 538, 553, 555, 582, 156/583.1; 226/181
See application file for complete search history.

(56) References Cited

U.S. PATENT DOCUMENTS

| 3,147,898 | A | * | 9/1964 | Huck | 226/17 |
| 4,068,789 | A | | 1/1978 | Young, Jr. et al. | |
| 4,938,821 | A | * | 7/1990 | Soderlund et al. | 156/85 |
| 6,902,053 | B1 | | 6/2005 | Long | |
| 2011/0086457 | A1 | * | 4/2011 | Yokoyama | 438/57 |

FOREIGN PATENT DOCUMENTS

| DE | 3048322 A1 | 10/1981 |
| JP | 8-500075 | 1/1996 |

(Continued)

OTHER PUBLICATIONS

Europe Patent Office, "European Search Report for EP 10845817.5," Dec. 11, 2013.

*Primary Examiner* — James Sells
(74) *Attorney, Agent, or Firm* — Manabu Kanesaka

(57) ABSTRACT

Provided is a position controller for a flexible substrate (100) provided in a processing apparatus conveying a band-shaped flexible substrate (1) in a longitudinal position, in the lateral direction and processing the substrate in a processing unit (20) installed on a conveying path of the substrate. The position controller for the flexible substrate includes a pair of sandwiching rollers (131 and 132) that sandwiches an upper edge of the substrate; a supporting mechanism (140) that supports the pair of sandwiching rollers so as to be rotatable and movable close to or away from each other; an urging device (150) that applies a pressing force to the pair of sandwiching rollers through the supporting mechanism; and a pressing force adjusting device (160) adjusting the pressing force from the urging device, wherein each roller constituting the pair of sandwiching rollers is a conical roller having a circumferential surface inclined with respect to the axial direction, and is supported to the supporting mechanism so that a small diameter side of each conical roller is located at a center side of the substrate in the lateral direction and the rotation direction of a sandwiching surface of the substrate is the same as the conveying direction of the substrate.

13 Claims, 14 Drawing Sheets

(56) References Cited

FOREIGN PATENT DOCUMENTS

| | | |
|---|---|---|
| JP | 2008-28394 | 2/2008 |
| JP | 2008-117889 | 5/2008 |
| JP | 2009-038276 | 2/2009 |
| JP | 2009-038277 | 2/2009 |
| JP | 2009-057632 | 3/2009 |
| WO | WO 2009122836 A1 * | 10/2009 |

* cited by examiner

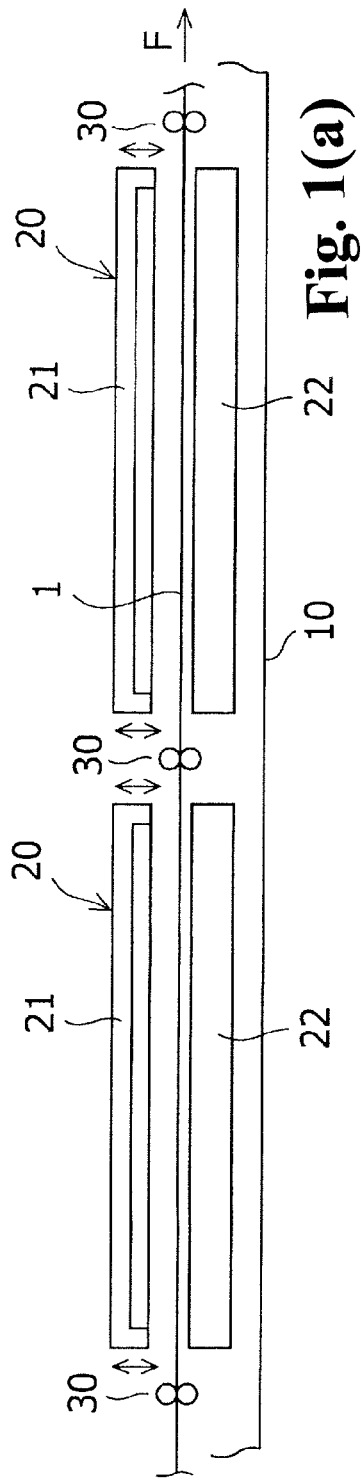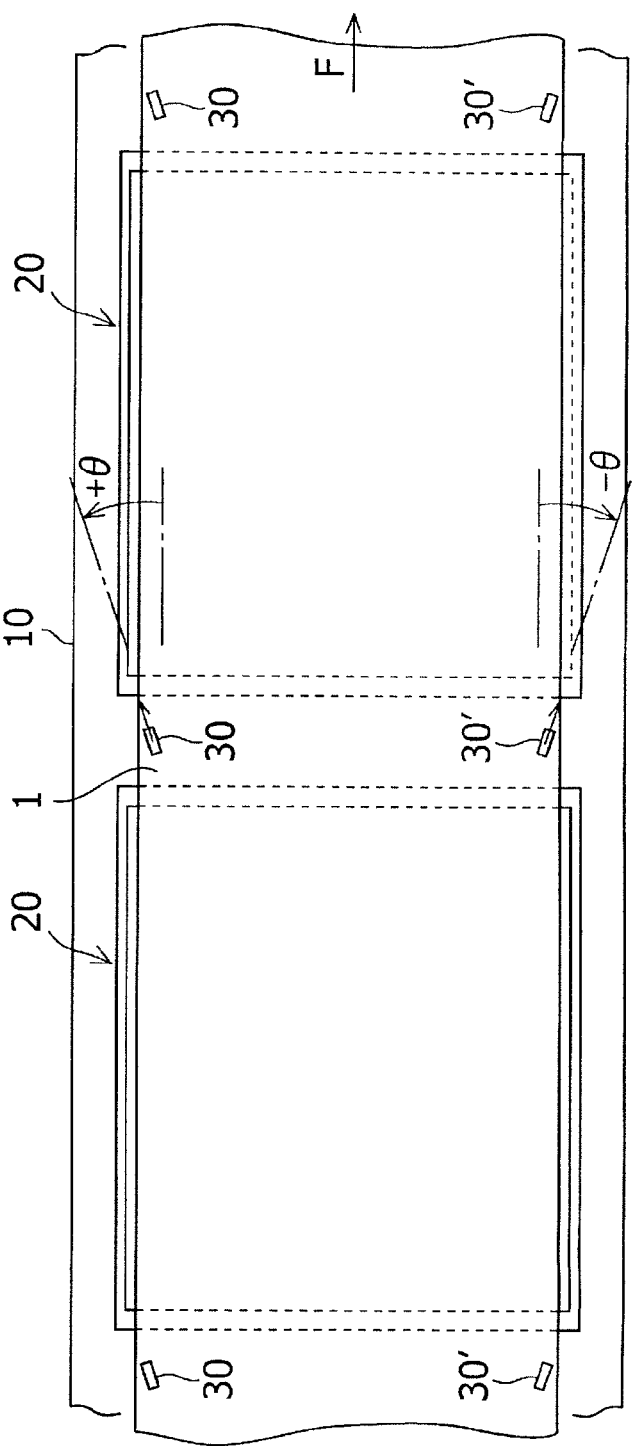
Fig. 1(a)
Fig. 1(b)

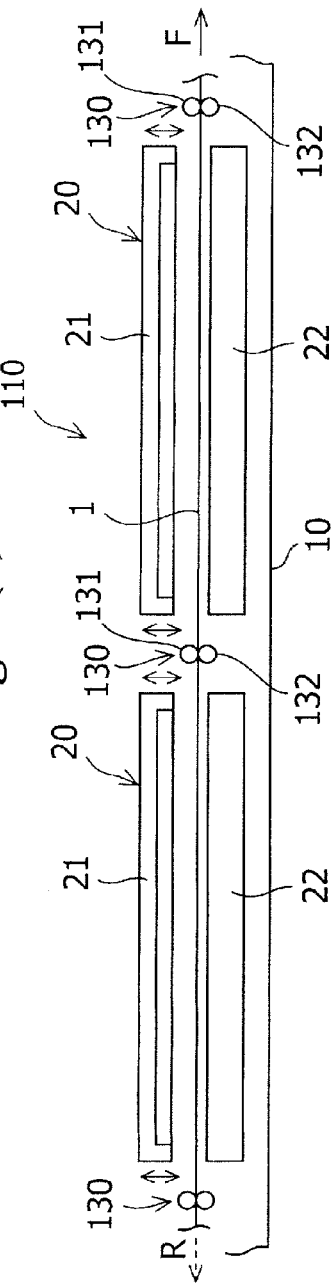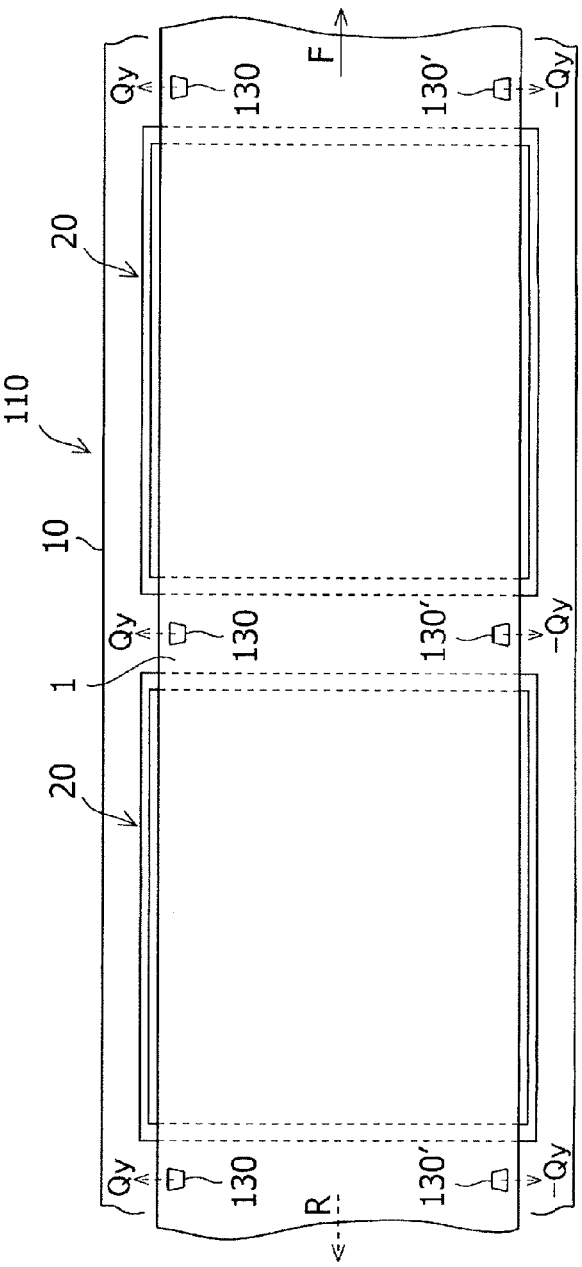

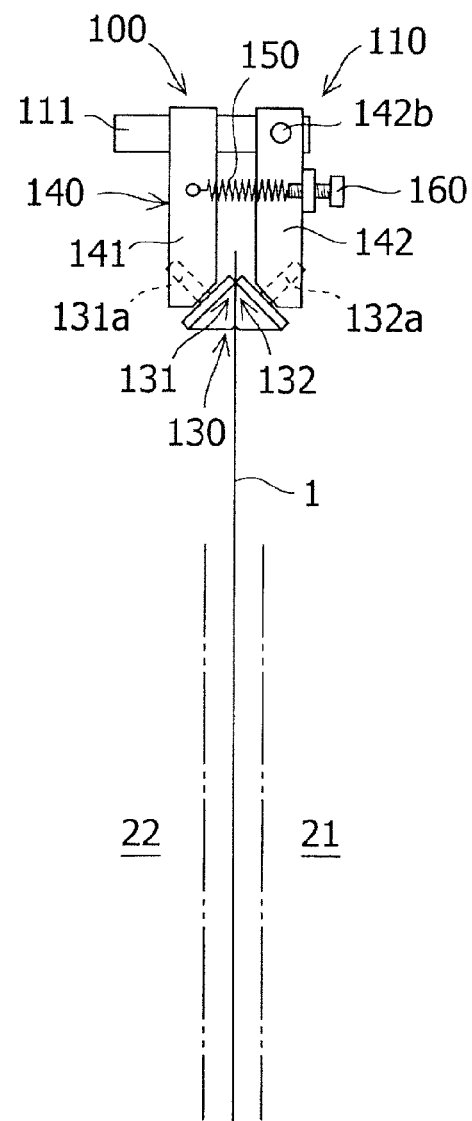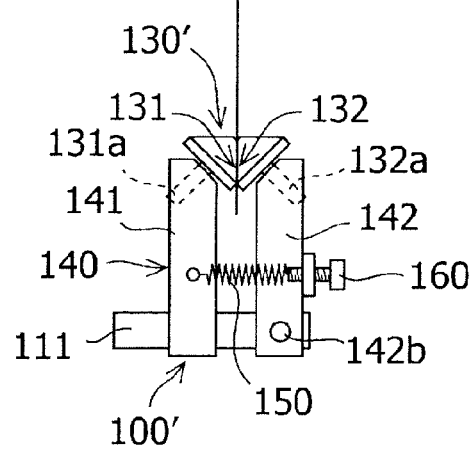
Fig. 5

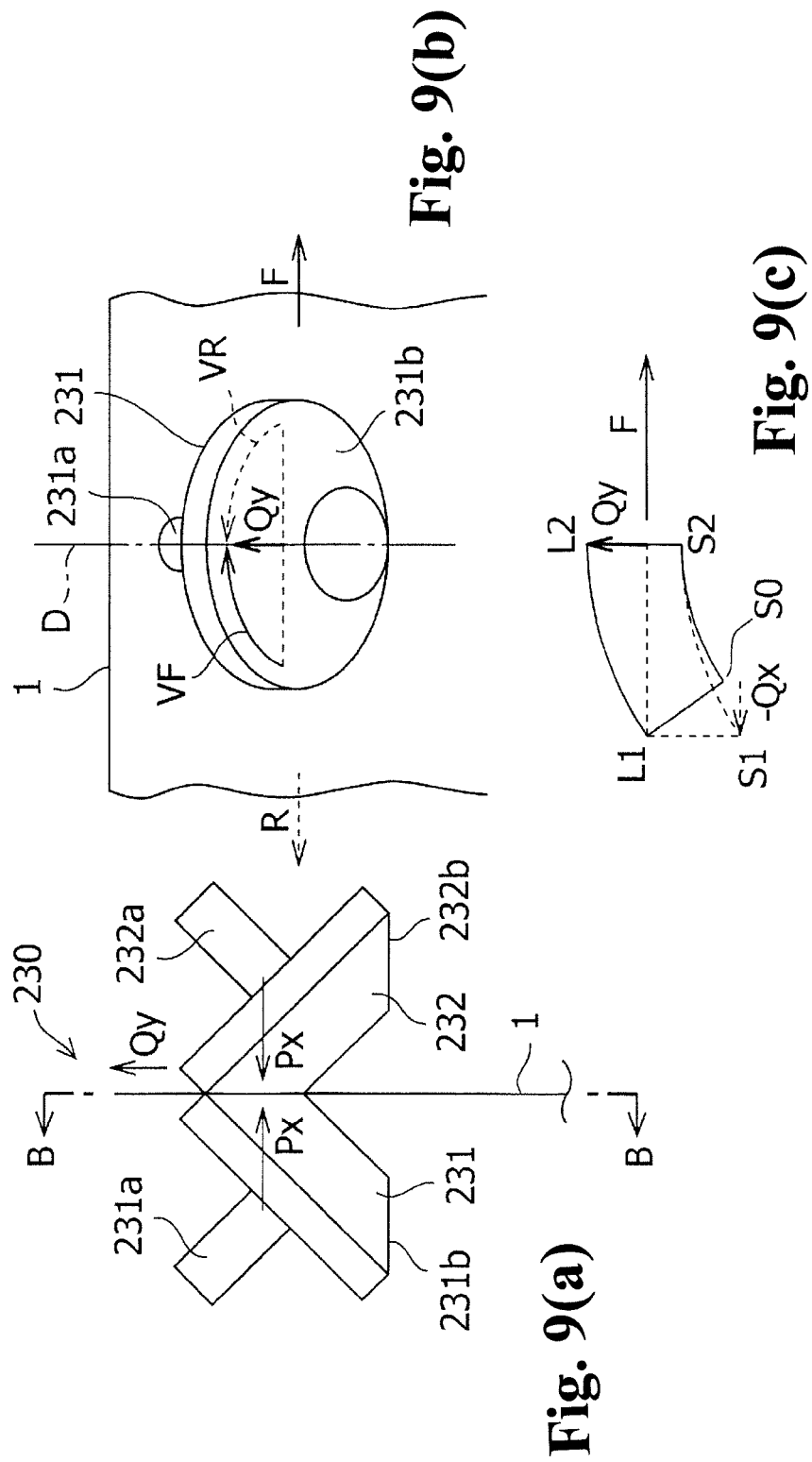

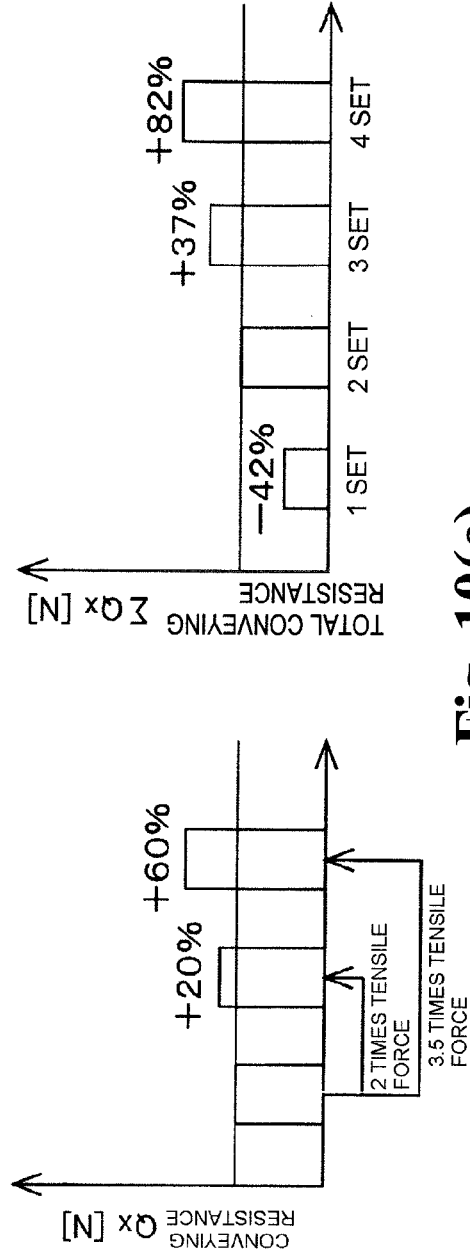
Fig. 10(a)
Fig. 10(b)
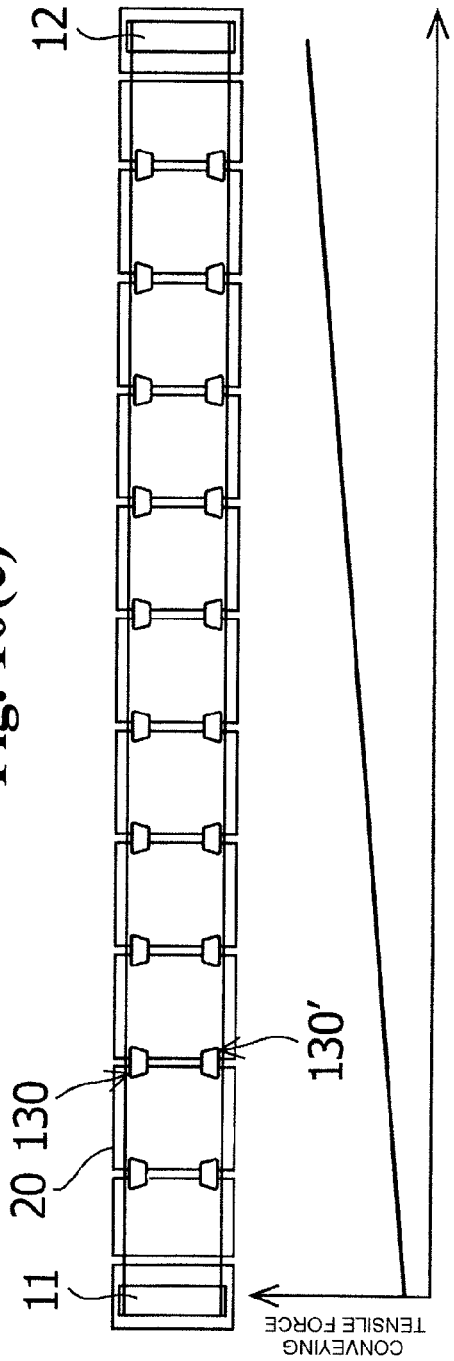
Fig. 10(c)

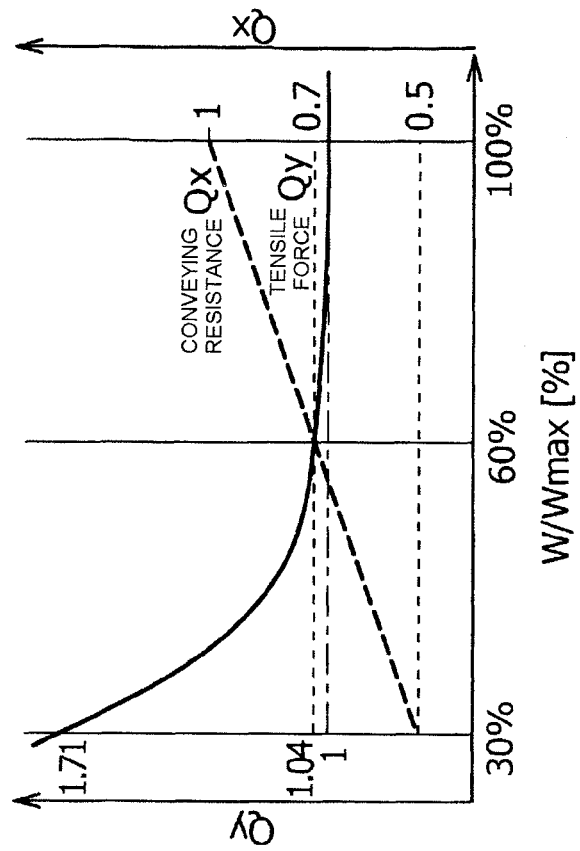
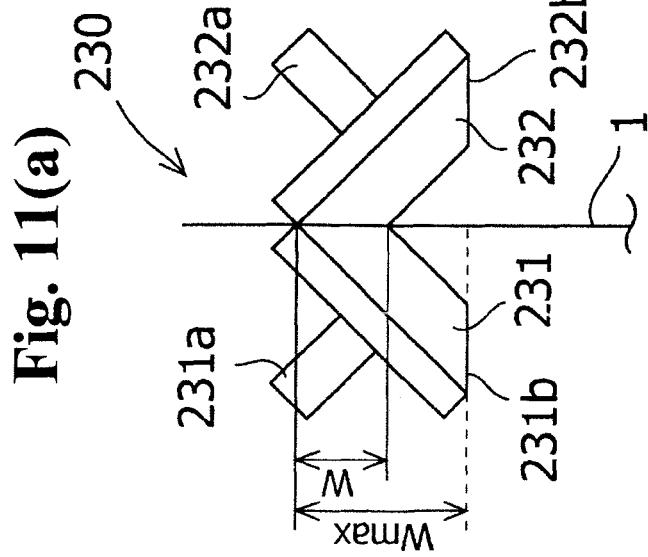
Fig. 11(a)
Fig. 11(b)

POSITION CONTROLLER FOR FLEXIBLE SUBSTRATE

RELATED APPLICATIONS

The present application is National Phase of International Application No. PCT/JP2010/072987 filed Dec. 21, 2010, and claims priorities from Japanese Application No. 2010-026502, filed Feb. 9, 2010 and Japanese Application No. 2010-162704, filed Jul. 20, 2010.

TECHNICAL FIELD

The present invention relates to a lateral position controller for a flexible substrate that is provided in an apparatus conveying a band-shaped flexible substrate and for performing a process such as film forming on the substrate in the conveying path thereof.

BACKGROUND ART

In general, a rigid substrate is used as a substrate of a thin film laminate of semiconductor thin films, but a flexible substrate such as a plastic film may be used in some cases for the purpose of improving productivity or reducing the cost because of the lightness and the easiness of handling attributed to the use of roll. Patent Literature 1 discloses a thin film laminated body manufacturing apparatus that conveys intermittently at a predetermined pitch a band-shaped flexible substrate (polyimide film) supplied from an unwinding roll, laminates a plurality of different thin films having different properties on the flexible substrate using a plurality of film forming units arranged in the conveying direction of the flexible substrate, and winds the substrate on a product roll.

In such the thin film laminated body manufacturing apparatus, there are known a type in which a film is formed while conveyed in a lateral position, that is, positioned from a width direction of a band-shaped flexible substrate to a horizontal direction, and a type in which a film is formed while conveyed in a longitudinal position, that is, positioned from a width direction of the band-shaped flexible substrate to a vertical direction. The latter type has benefits in that the installation area is small and the surface of the substrate is not easily contaminated compared to the former type. However, when the conveying span is lengthened, it is difficult to maintain the conveying height to be constant against the gravity, and there is a noticeable tendency that wrinkles occur on the surface of the flexible substrate or the flexible substrate is drooped.

Therefore, as shown in FIGS. 1A and 1B, the inventors have contrived a device adjusting a conveying height of a flexible substrate 1 in a manner such that a pair of upper sandwiching rollers 30 and a pair of lower sandwiching rollers 30' are disposed between film forming units 20 and 20 constituting a thin film laminated body manufacturing apparatus so as to respectively sandwich the upper and lower edges of the flexible substrate 1, and an upward lifting force and a downward pulling force are applied to the upper and lower edges of the flexible substrate 1 so that the rotation directions of the sandwiching portions of respective sandwiching rollers have the inclination angles +θ and −θ directed obliquely upward and downward with respect to the conveying direction F of the flexible substrate 1 (refer to Patent Literatures 1 to 3).

CITATION LIST

Patent Literature

Patent Literature 1: Japanese Patent Application Laid-Open (JP-A) No. 2009-38276
Patent Literature 2: JP-A No. 2009-38277
Patent Literature 3: JP-A 2009-57632

DISCLOSURE OF INVENTION

Problem to be Solved by the Invention

The device may be advantageously used to stretch the flexible substrate and control the conveying height of the flexible substrate, but may not be promptly applied to a reciprocating film forming process including reverse conveying of the flexible substrate. When the flexible substrate is conveyed in the reverse direction, the lifting force and the downward pulling force along the inclination angles are exerted in the opposite vertical direction, so that a problem arises in that the flexible substrate is separated from the sandwiching rollers 30 and 30'.

The invention is made in view of the above-described problems, and an object of the invention is to provide a position controller for flexible substrate capable of suppressing drooping or wrinkles of a band-shaped flexible substrate, performing a high-quality process, and handling reverse conveying of the flexible substrate.

Means for Solving Problem

In order to solve the above-described problem, according to an embodiment of the invention, there is provided a position controller for flexible substrate provided in a processing apparatus conveying a band-shaped flexible substrate in a longitudinal position in the lateral direction and processing the substrate in a processing unit installed on a conveying path of the substrate, the position controller flexible substrate including a pair of sandwiching rollers sandwiching an upper edge of the substrate; a supporting mechanism supporting rotatably the pair of sandwiching rollers and capable of moving close to or away from each other; an urging device urging a pressing force to the pair of sandwiching rollers through the supporting mechanism; and a pressing force adjusting device adjusting the pressing force from the urging device. Each roller constituting the pair of sandwiching rollers is a conical roller having a circumferential surface inclined with respect to the axial direction, and is supported by the supporting mechanism to dispose a small diameter side of each conical roller at a center side of the substrate in the lateral direction and to direct the rotation direction of a sandwiching surface of the substrate in the same direction as the conveying direction of the substrate.

In the processing apparatus, the flexible substrate is conveyed by a conveying unit such as a feeding roll disposed at each of the upstream and the downstream of the processing unit (the film forming unit) while taking a longitudinal position, that is, setting the lateral direction as the vertical direction, and a process such as film forming is performed thereon at the processing unit installed on the conveying path. At this time, although the pair of sandwiching rollers sandwiching the upper edge of the flexible substrate is rotated by the conveying force of the flexible substrate, since each conical roller constituting the sandwiching roller has a difference in circumference between the large diameter side and the small diameter side, the sandwiching rollers are led to the center of the flexible substrate in the lateral direction, and as a result of the relative movement, a tensile force is applied to the flexible substrate toward the upside corresponding to the lateral edge.

Since the tensile force is transmitted to the flexible substrate through a frictional force on the circumferential surface of the roller, the tensile force is proportional to the pressing force of the pair of sandwiching rollers. When the pressing force is sufficiently large, the tensile force according to the inclination angle of the circumferential surface of the roller is directly applied to the flexible substrate. However, a sliding action occurs more frequently in the sandwiching surface as the pressing force decreases, so that the tensile force decreases. Therefore, when the pressing force from the urging device is adjusted, the tensile force applied to the flexible substrate may be adjusted, whereby the vertical lateral position of the flexible substrate may be adjusted and the conveying height may be maintained to be constant. Further, since the upper edge of the flexible substrate is stretched toward the edge, it is possible to suppress the drooping or wrinkles of the substrate at the intermediate portion of the conveying span and perform a high-quality process on the flexible substrate.

Furthermore, since the control of the pressing force is not dependent on the rotation direction of the sandwiching surface of the sandwiching roller and the rotation direction of the sandwiching surface is in the same direction as the conveying direction, the position of the substrate may be controlled to be located at the completely same position using the same device even when the substrate is conveyed in the reverse direction, and the reciprocating process including reverse conveying of the flexible substrate may be handled at low cost.

In the preferred embodiment of the invention, each roller constituting the pair of sandwiching rollers is a truncated conical roller. As described above, the conical roller has a difference in circumference between the large diameter side and the small diameter side. Accordingly, the tensile force is generated for the flexible substrate, and a conveying load is generated due to a difference in speed in the contact range. Since each roller constituting the sandwiching roller is configured as a truncated conical roller, the width of the contact portion is shortened, and the conveying load may be advantageously reduced.

In this case, the inclination angle of the circumferential surface of each conical roller with respect to a rotation shaft may be set to be from 20° to 80°. When the inclination angle is less than 20°, the tensile force abruptly decreases. Further, when the inclination angle is larger than 80°, it is difficult to configure the device. In a particularly desirable embodiment, the inclination angle of the circumferential surface of each conical roller with respect to a rotation shaft is set to be from 45° to 65°. Generally, the conveying resistance also increases with an increase in the inclination angle, but when the inclination angle is 45° or more, the conveying resistance very slightly increases. Further, when the inclination angle becomes more than 65°, the tensile force hardly increases.

The invention is also applied to an embodiment in which a pair of sandwiching rollers is disposed at each of upper and lower sides of the flexible substrate. That is, in the preferred embodiment of the invention, there are further provided pair of lower sandwiching rollers that sandwiches a lower edge of the substrate; and a supporting mechanism and an urging device that are configured in the same manner as the supporting mechanism and the urging device and support the pair of lower sandwiching rollers. In this embodiment, the flexible substrate is moved upward or downward due to a difference in stretching component of the pressing force acting on the upper and lower sandwiching surfaces through the adjustment of the pressing force while stretching the flexible substrate in both upper and lower lateral directions, so that the conveying height may be controlled. Accordingly, the wrinkles of the flexible substrate may be effectively suppressed and the positional precision of the flexible substrate may further improve.

In the preferred embodiment of the invention, the processing apparatus is a thin film laminated body manufacturing apparatus that includes a plurality of film forming portions serving as the processing unit and disposed in parallel at the same pitch in the conveying path of the substrate and sequentially laminates thin films on the surface of the substrate while intermittently conveying the substrate at the pitch corresponding to the film forming unit. The pair of upper sandwiching rollers and the pair of lower sandwiching rollers are disposed between the plurality of film forming portions.

In another preferred embodiment of the invention, the processing apparatus is a thin film laminated body manufacturing apparatus that continuously conveys the substrate and laminates thin films on the surface of the substrate in a film forming portion as the processing unit. The plurality of pairs of upper sandwiching rollers and the plurality of pairs of lower sandwiching rollers are disposed at the upper and lower sides of the film forming portion in the conveying direction.

In the embodiment, a plurality of support rollers may be further provided in series in the conveying direction so as to support the substrate while being located at a position between a thin film forming region of the substrate and the plurality of pairs of upper sandwiching rollers and a position between the thin film forming region and the plurality of pairs of lower sandwiching rollers. In this embodiment, the flexible substrate may be reliably supported around the film forming portion by the heat-resistant support roller not including the movable portion for adjusting the pressing force, the group of the pair of sandwiching rollers may be disposed in the film forming portion to be away from each other, the influence of the radiation heat with respect to the sandwiching roller may be reduced, and a degree in freedom of selecting the material of the sandwiching roller advantageously improves.

The invention may also be applied to a position controller for flexible substrate in a processing apparatus that conveys a band-shaped flexible substrate in a horizontal position other than the longitudinal position in the lateral direction, the vertical direction, or the inclined direction and performs a process such as film forming thereon.

That is, the invention may be applied to a position controller for flexible substrate provided in a processing apparatus conveying a band-shaped flexible substrate and processing the substrate in a processing unit installed on a conveying path of the substrate, the position controller for flexible substrate including each pair of sandwiching rollers sandwiching each edge of the substrate, each supporting mechanism supporting rotatably and capable of moving close to away from each other in each pair; an urging device urging a pressing force to each pair of sandwiching rollers through each supporting mechanism; and a pressing force adjusting device adjusting the pressing force from the urging device. Each roller constituting each pair of sandwiching rollers is a conical roller having a circumferential surface inclined with respect to the axial direction, and is supported by each supporting mechanism to dispose a small diameter side of each conical roller at a center side of the substrate in the lateral direction and to direct the rotation direction of a sandwiching surface of the substrate in the same direction as the conveying direction of the substrate.

In this embodiment, the sandwiching rollers configured as a pair of conical rollers sandwiching each edge of the flexible substrate are rotated by the conveying force of the flexible substrate, the sandwiching rollers are led to the center of the flexible substrate in the lateral direction according to a difference in circumference between the large diameter side and the small diameter side, and as a result of the relative movement, a tensile force is applied to the flexible substrate toward the lateral edge. Since the tensile force changes in accordance with the pressing force from each urging device, when the pressing force from each urging device is adjusted, it is possible to adjust the lateral position of the flexible substrate and suppress meandering of the flexible substrate while stretching the substrate in the lateral direction. Furthermore, since such an action is not dependent on the rotation direction of each sandwiching roller and the rotation direction of each sandwiching surface is in the same direction as the conveying direction of the substrate, the same position control may be performed even in the reverse conveying.

Even in this embodiment, each roller constituting the pair of sandwiching rollers may be formed as a truncated conical roller.

Effect of the Invention

As described above, the position controller for flexible substrate according to the invention may effectively suppress drooping or wrinkles of the flexible substrate when performing a process such as film forming on the conveying band-shaped flexible substrate, maintaining the lateral position to be constant to perform a high-quality process thereon, and handling a reciprocating process including reverse conveying of the flexible substrate at low cost.

BRIEF DESCRIPTION OF DRAWINGS

FIG. 1A is a schematic plan cross-sectional view illustrating two film forming units of a thin film laminated body manufacturing apparatus, and FIG. 1B is a schematic side cross-sectional view thereof.

FIG. 4A is a schematic plan cross-sectional view illustrating two film forming units of a thin film laminated body manufacturing apparatus including the position controller for substrate according to the embodiment of the invention, and FIG. 4B is a schematic side cross-sectional view thereof.

FIG. 5 is a cross-sectional view taken along the line A-A of FIG. 4 and illustrating a case where the position controller for substrate according to the first embodiment of the invention is provided.

FIG. 9A is an enlarged view illustrating a main part of FIG. 2, FIG. 9B is a cross-sectional view taken along the line B-B of FIG. 9A, and FIG. 9C is an enlarged view illustrating a stretching action of the sandwiching roller in FIG. 9B.

FIG. 10A is a diagram illustrating a relation between a conveying tensile force and a conveying resistance, FIG. 10B is a diagram illustrating a relation between the number of the sandwiching rollers and the conveying resistance, and FIG. 10C is a diagram illustrating a distribution of the tensile force in the thin film laminated body manufacturing apparatus.

FIG. 11 is a diagram illustrating a relation among a width of a contact portion of the sandwiching roller, a tensile force, and a conveying resistance.

BEST MODES FOR CARRYING OUT THE INVENTION

Figure 2:
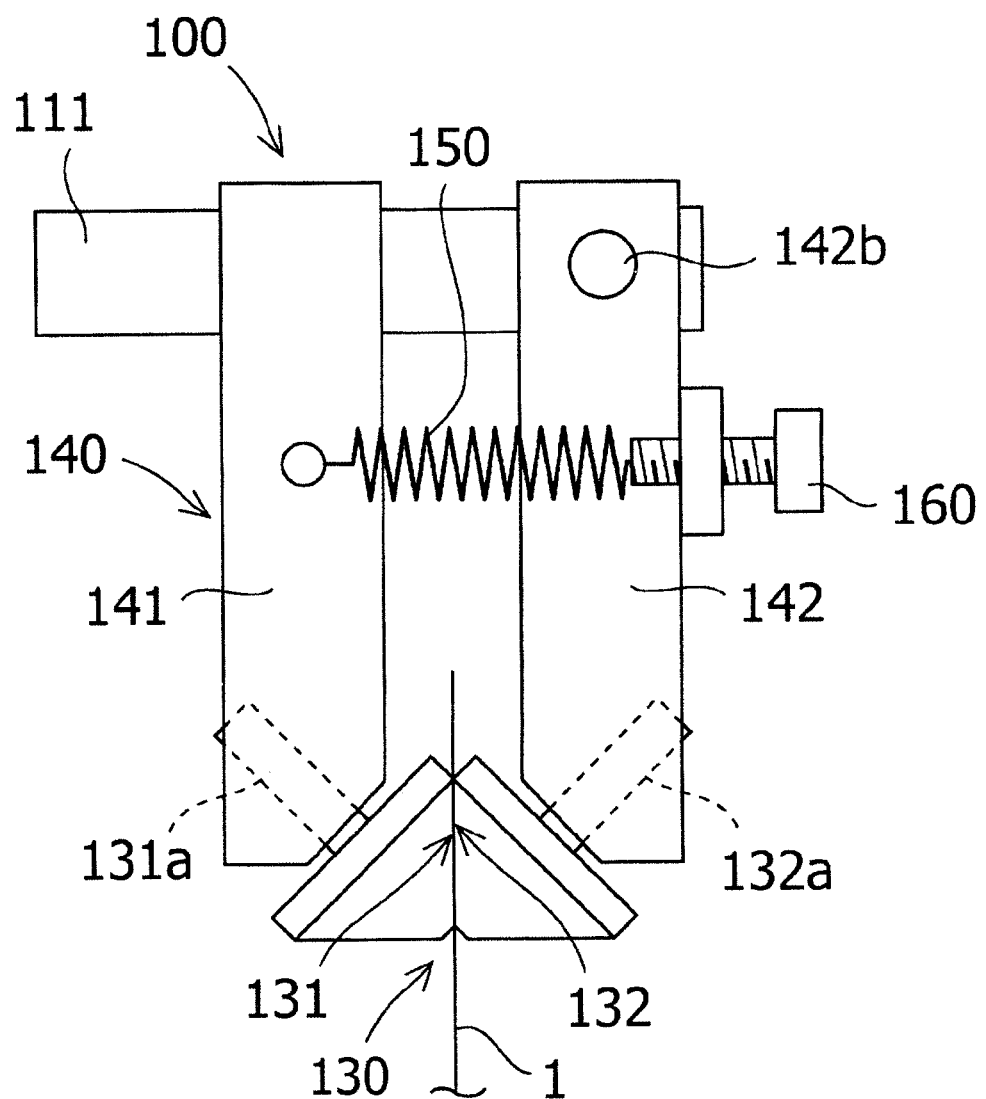
FIG. 2 is a front view illustrating a position controller for substrate according to a first embodiment of the invention.

Hereinafter, embodiments of the invention will be specifically described with reference to the drawings by exemplifying a case in which the invention is applied to a position controller for substrate of a thin film laminated body manufacturing apparatus forming a thin film photoelectric converting element for a solar cell. Furthermore, in the description below, the same reference numerals are given to the same or equivalent components of the respective embodiments, and the components are not repetitively described.

(First Embodiment)

FIG. 2 is a front view illustrating a position controller for substrate 100 according to a first embodiment of the invention when seen from the upstream in the conveying direction. As partially shown in FIGS. 4A and 4B, the thin film laminated body manufacturing apparatus conveys a band-shaped flexible substrate 1 (flexible film) in the horizontal direction inside a vacuum chamber 10 maintained at a predetermined vacuum degree while taking a longitudinal position, that is, the lateral direction is set as the vertical direction, and laminates thin films on the surface of the flexible substrate 1 using a plurality of film forming units 20 (film forming portions) arranged in parallel along the conveying path of the flexible substrate 1.

Feeding roll or tension roll constituting a conveying unit of the flexible substrate 1 are disposed at the upstream and the downstream in the conveying direction of the film forming portion, and an unwinding roll and a winding roll of the flexible substrate 1 are further disposed at the upstream and the downstream in the conveying direction. Further, guide rolls (idle roll) are disposed between the feeding roll and the film forming portion of the upstream and the downstream so as to guide the flexible substrate 1 while being folded back at the upstream and the downstream of the film forming portion and set the linear conveying path of the flexible substrate 1 in the film forming portion. Since this configuration is the same as that of the related art, the configuration is not described in detail, but is schematically shown in FIG. 10C.

The position controller for substrate 100 is disposed at the upper portion of the conveying path in the film forming portion so as to control the vertical position of the flexible substrate 1 conveyed through the film forming portion while being suspended between the guide rolls so that the conveying height is maintained to be constant and the flexible substrate 1 is stretched in the lateral direction, that is, the vertical direction, and includes: a pair of sandwiching rollers 130 sandwiching the upper edge of the flexible substrate 1; a supporting mechanism 140 supporting the rollers 131 and 132 constituting the pair of sandwiching rollers 130 rotatably to move close to or away from each other; an urging device (150) urging a pressing force to the pair of sandwiching rollers 130 (131 and 132) through the supporting mechanism 140; a pressing force adjusting device (160); and the like as shown in FIG. 2.

Figure 3A:
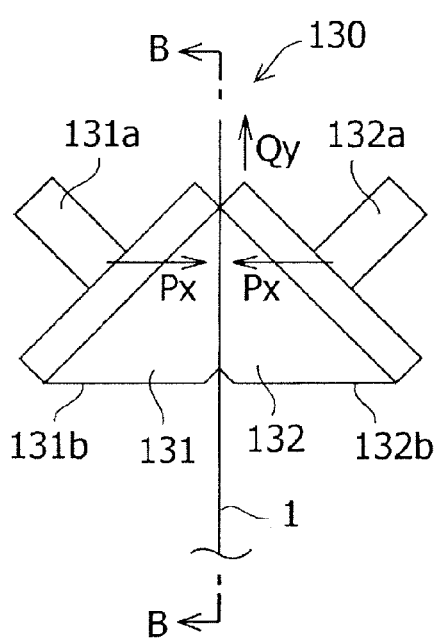
FIG. 3A is an enlarged view illustrating a main part of FIG. 2.
Figure 3B:
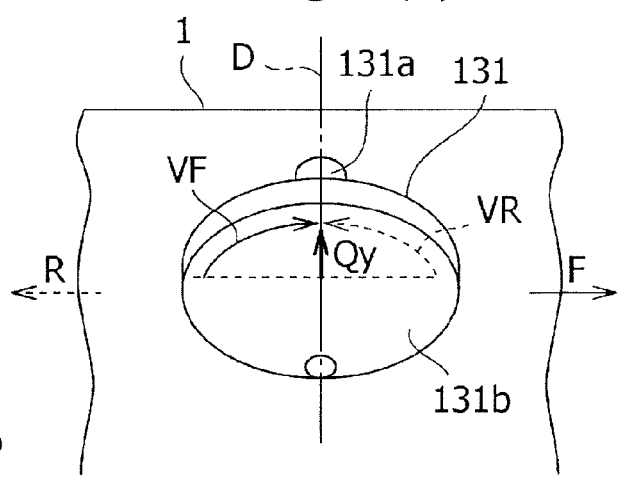
FIG. 3B is a cross-sectional view taken along the line B-B of FIG. 3A.

As shown in FIGS. 3A and 3B, the rollers 131 and 132 constituting the pair of sandwiching rollers 130 are all formed as conical rollers formed in the same shape to have circumferential surfaces 131b and 132b inclined with respect to the axial direction. One of them is a fixed roller 131, the other is a movable roller 132, the fixed roller 131 is rotatably supported by a shaft 131a, and the movable roller 132 is rotatably supported by a shaft 132a.

While the sandwiching rollers 131 and 132 come into press-contact with each other with the flexible substrate 1 interposed therebetween, each front end side (small diameter side) is located at the downside of the drawing corresponding to the center in the vertical width direction of the flexible substrate 1, and each large diameter portion is located at the upside of the drawing corresponding to the edge side of the flexible substrate 1. Further, in order to sandwich the upper edge of the flexible substrate 1 between the sandwiching surfaces being flat with respect to the conveying surface, the shafts 131a and 132a form an inclination angle corresponding to the inclination (that is, the vertex angle of the conical shape) of each of the circumferential surfaces 131b and 132b with respect to the conveying surface (flexible substrate 1) within the imaginary plane D perpendicular to the conveying direction of flexible substrate 1, and are obliquely held by the front ends of a fixed support member 141 and a movable support member 142. Accordingly, the rotation direction in the sandwiching surfaces of the sandwiching rollers 131 and 132 is set to be the same direction as the conveying direction of the flexible substrate 1.

The upper end of the fixed support member 141 is fixed to a bracket 111, and the bracket 111 is fixed to a structure component of a vacuum chamber (not shown). The fixed support member 141 and the bracket 111 may be integrally formed with each other. On the other hand, a hinge 142b of the upper end of the movable support member 142 is swingably connected to the bracket 111, and when the movable support member 142 swings about the hinge 142b, the movable roller 132 is movable to be close to or away from the fixed roller 131.

A spring 150 (tension spring) as an urging device is interposed between the fixed support member 141 and the movable support member 142. One end of the spring 150 is connected to the fixed support member 141, and the other end of the spring 150 is connected to the movable support member 142 through a pressing force adjusting screw 160. When the pressing force adjusting screw 160 rotates to adjust the initial displacement of the spring 150, the pressing force (contact pressure) of the movable roller 132 with respect to the fixed roller 131 may be adjusted.

Each of the sandwiching rollers 131 and 132 constituting the pair of sandwiching rollers 130 is formed of, for example, metal, ceramic, plastic, or the like, or is formed by attaching an elastic body such as rubber to a circumference of a core body formed of such a material. The rollers 131 and 132 are rotatably supported through bearings capable of receiving a thrust load so as to be held at predetermined axial positions with respect to the shafts 131a and 132a (support shafts). Approximately, the shafts 131a and 132a (rotary shafts) may be rotatably supported to the front ends of the fixed support member 141 and the movable support member 142 through a bearing capable of receiving a thrust load.

In the position controller for substrate 100 with the above-described configuration, there is a difference in circumferential length between the large diameter side and the small diameter side of each of the sandwiching rollers 131 and 132. Accordingly, as shown in FIG. 3B, the sandwiching rollers 131 and 132 generate a rotational force VF (VR) on the contact surface (sandwiching surface) when being driven by the contact with the flexible substrate 1 moving in the conveying direction F (R). However, since the flexible substrate 1 is linearly conveyed while a predetermined conveying tensile force is applied thereto, only the partial force Qy (tensile force) in the perpendicular direction of the rotational force VF (VR) is transmitted to the contact surface of the flexible substrate 1, and the upper edge of the flexible substrate 1 is stretched upward by the upward tensile force Qy.

Since the tensile force Qy generated by each of the sandwiching rollers 131 and 132 is transmitted as a frictional force to the flexible substrate 1, the tensile force is basically proportional to the pressing force Px generated by each of the sandwiching rollers 131 and 132. Since the pressing force Px generated by each of the sandwiching rollers 131 and 132 is proportional to the elastical displacement of the spring 150, when the initial displacement of the spring 150 is adjusted by rotating the pressing force adjusting screw 160, the tensile force Qy with respect to the upper edge of the flexible substrate 1 may be adjusted. Since the tensile force Qy serves as a lifting force that lifts the upper edge of the flexible substrate 1 against the gravity, the position of the upper edge of the flexible substrate 1 may be adjusted.

Furthermore, in the example shown in the drawings, a case is shown in which the apparatus is operated by setting the pressing force to the optimal value obtained from a test operation by the use of the manual pressing force adjusting screw 160 as the pressing force adjusting device. However, the conveying height of the flexible substrate 1 may be controlled through a feed-back control using an actuator rotating the pressing force adjusting screw 160 or directly or indirectly displacing the support point of the spring 150 through a mechanism, a sensor detecting the position of the upper edge of the flexible substrate 1, and a control device controlling the actuator on the basis of the detection value of the sensor.

Figure 7:
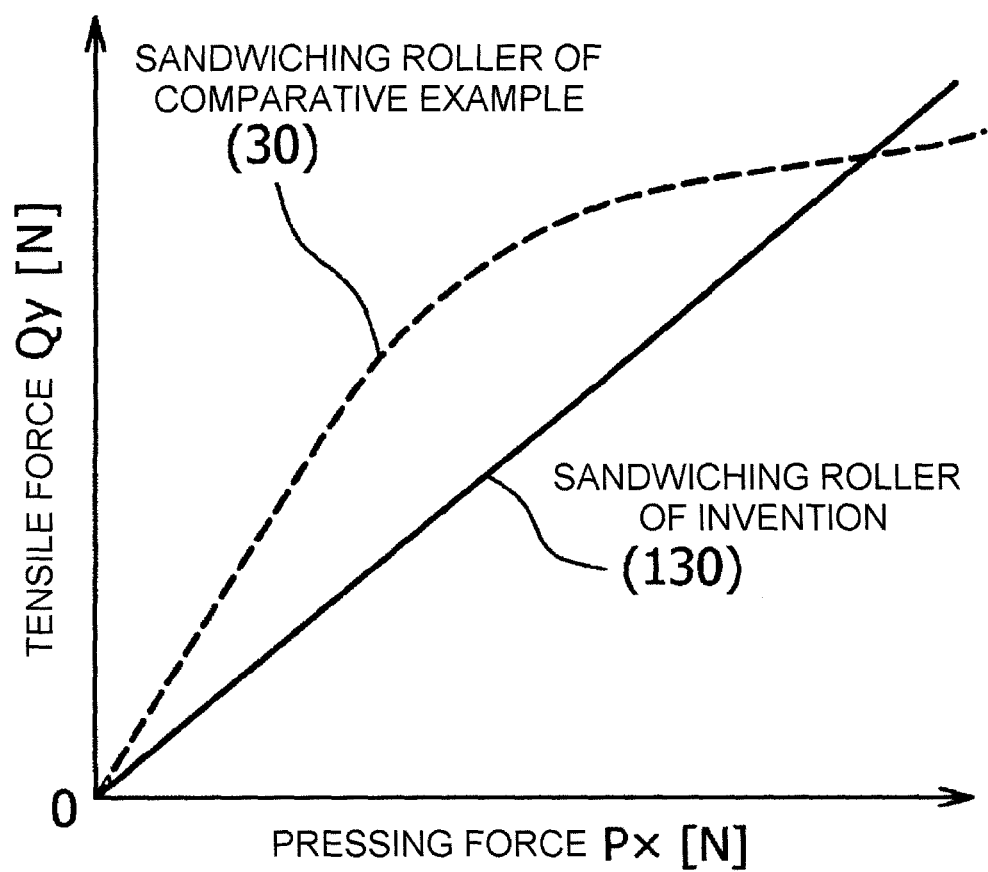
FIG. 7 is a graph illustrating a relation between a pressing force and a tensile force in the sandwiching roller according to the invention and the sandwiching roller according to the comparative example.

FIG. 7 is a graph illustration a relation between the pressing force Px and the tensile force Qy of the conical sandwiching roller (130) according to the embodiment of the invention and the cylindrical sandwiching roller (30) shown in FIG. 1 as a comparative example. The tensile force Qy of the cylindrical sandwiching roller (30) depicted by the dashed line of the drawing increases in proportional to the pressing force Px within a range with a comparatively small pressing force Px. However, when the pressing force Px further increases, the tensile force tends to be gradually saturated, but the tensile force Qy of the conical sandwiching roller (130) depicted by the solid line of the drawing tends to increase in proportional to the pressing force Px in the wide range. This is because the conical sandwiching roller (130) is not inclined with respect to the conveying direction and the mechanism generating the tensile force Qy is different compared to the tensile force Qy of the cylindrical sandwiching roller (30) dependent on the inclination angle θ with respect to the conveying direction.

Figure 6A:
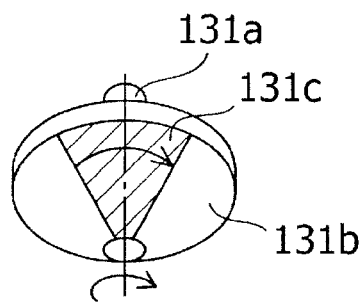
FIG. 6A is a cross-sectional view taken along the line B-B of FIG. 3A and illustrating a case of a standard pressing force.
Figure 6B:
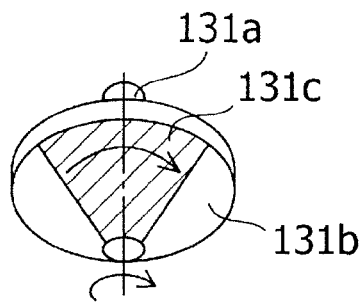
FIG. 6B illustrates a case where the pressing force increases.
Figure 6C:
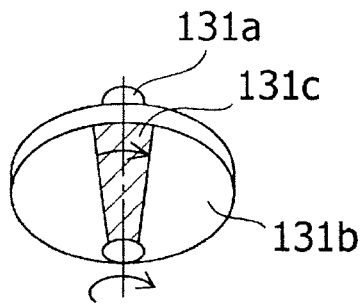
FIG. 6C illustrates a case where the pressing force decreases.

FIG. 6A visually illustrates the enlarged contact surface (sandwiching surface) in the circumferential direction in the case where the standard pressing force is exerted, FIG. 6B corresponds to the case where the pressing force increases, and FIG. 6C corresponds to the case where the pressing force decreases. Since the sandwiching roller 131 (132) is formed in a conical shape, the contact surface 131c with respect to the flexible substrate 1 is formed in a fan shape or a wedge shape, and as the pressing force Px increases, the substantial sandwiching point (to be described later) formed by the sandwiching rollers 131 and 132 is shifted to the large diameter side.

Furthermore, when the pressing force Px is large, the tensile force Qy is transmitted to the flexible substrate 1 in accordance with the shape of each of the sandwiching rollers 131 and 132. However, when the pressing force Px is small, the sliding action within the contact surface occurs more gradually, so that the transmitted tensile force Qy decreases. Due to the unique characteristics of the mechanism generating the tensile force Qy, the tensile force Qy may be increased in proportional to the pressing force Px in the wide range, and even in the region where the pressing force Px is large, the tensile force Qy is not easily saturated.

Next, FIGS. 4A, 4B, and 5 illustrate embodiments in which the position controller for substrate 100 of the first embodiment is applied to a stepwise thin film forming apparatus 110 shown in FIG. 1. Only one film forming unit 20 is shown in FIG. 4, but as assumed above, the plurality of film forming units 20 are disposed in parallel inside the common vacuum chamber 10 in the conveying direction. Each film forming unit 20 is formed as a vacuum depositing unit that performs chemical vapor deposition (CVD) such as plasma CVD or physical vapor deposition (PVD) such as sputtering.

Each film forming unit 20 includes an electrode 21 (a high frequency electrode or a target having a plurality of raw gas discharging holes formed on the surface) and a ground electrode 22 having a heater embedded therein disposed to face each other with the flexible substrate 1 interposed therebetween, and each of the electrode 21 and the ground electrode 22 is received in a chamber opened toward the conveying surface of the flexible substrate 1. In the stepwise film forming process, since the electrode 21 and/or the ground electrode 22 move forward and backward to open the chamber when stopping a stepwise conveying operation corresponding to one film forming unit 20, the pair of sandwiching rollers 130 may not be installed between the electrode 21 and the ground electrode 22.

Therefore, in the stepwise film forming apparatus 110, the position controller for substrate 100 is installed at a position before or behind the film forming unit 20, that is, a position between the film forming units 20. In the example shown in the drawing, a pair of sandwiching rollers 130 and 130' is respectively disposed at the upper and lower sides of the conveying path. As shown in FIG. 5, the pair of lower sandwiching rollers 130' may have the same structure as that of the pair of upper sandwiching rollers 130 so that the structure is reversed in the vertical direction.

In this embodiment, the downward tensile force −Qy is exerted downward with respect to the lower edge of the flexible substrate 1 from the pair of lower sandwiching rollers 1 in parallel 30' together with the tensile force Qy exerted upward with respect to the upper edge of the flexible substrate 1 from the pair of upper sandwiching rollers 130, so that the flexible substrate 1 is stretched to both sides in the vertical direction and such a difference serves as a lifting force against the gravity of the flexible substrate 1. Therefore, in the pair of upper and lower sandwiching rollers 130 and 130', the tensile force of the pair of upper sandwiching rollers 130 is set to be larger than that of the pair of lower sandwiching rollers 130' when the influence of the gravity is large due to the long conveying span or the like.

As described above, when the sandwiching rollers 131 and 132 constituting the position controller for substrate 100 are rotated by the contact with respect to the flexible substrate 1, the rotational force VF (VR) is generated in the contact surface (sandwiching surface) and the vertical partial force is transmitted as the tensile force Qy to the flexible substrate 1. More specifically, in the conical sandwiching rollers 131 and 132 each having a difference in circumferential length between the large diameter side and the small diameter side, the substantial sandwiching point (the point where the conveying force of the flexible substrate 1 is transmitted as a stop frictional force to the sandwiching roller) where the circumferential speed is equal to the conveying speed of the flexible substrate 1 becomes the large diameter side point where the transmitting torque is large, and a sliding action is generated in the opposite direction to the conveying direction F of the flexible substrate 1 at the small diameter side in relation to the point due to a difference in circumferential speed.

Figure 3C:
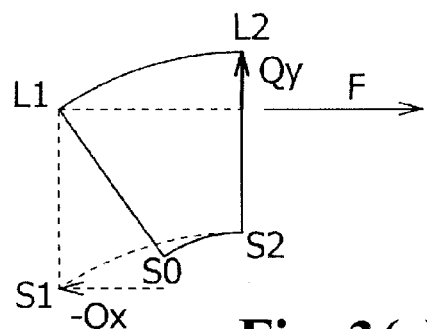
FIG. 3C is an enlarged view illustrating a stretching action of a sandwiching roller in FIG. 3B.

In FIG. 3C corresponding to the enlarged view of FIG. 3(b), the small diameter side of the conical sandwiching roller 131 rotates from S0 to S2 while the substantial sandwiching point moves from L1 to L2. However, since the axial direction of the sandwiching roller 131 is maintained to be constant, the small diameter side of the sandwiching roller 131 is located at S1 when the sandwiching point is located at L1, and the flexible substrate 1 generates a sliding action in the opposite direction to the conveying direction F as much as a difference between S1 and S0, so that the sliding action is transmitted to the flexible substrate 1 as a frictional force and becomes a conveying resistance Qx.

FIG. 10A illustrates a change of the conveying resistance Qx in accordance with the conveying tensile force of the position controller for substrate 100 according to the invention, and FIG. 10B illustrates a relation between the number of sandwiching rollers and a total conveying resistance ΣQx. Further, FIG. 10C illustrates a distribution of the conveying tensile force in the thin film laminated body manufacturing apparatus including the position controller for substrate (the pair of sandwiching rollers 130 and 130') according to the invention, where the thin film laminated body manufacturing apparatus is shown in which nine film forming units 20 (CVDs 1 to 9) are installed in the conveying path from an unwinding portion 11 of the flexible substrate 1 to a winding portion 12 along the horizontal axis, and the position controller for substrate (the pair of sandwiching rollers 130 and 130') is installed between the film forming units 20.

The conveying resistance Qx caused by the position controller for substrate increases in proportional to the number of the control devices, increases or decreases in accordance with an increase or decrease in conveying tensile force, and is applied to the feeding roller or the tension roller installed at the downstream in the conveying direction. When the conveying resistance Qx increases, a load with respect to the conveying unit increases, and a difference in tensile force is generated at the upstream and the downstream of the conveying path. For this reason, it is desirable to decrease the conveying resistance Qx as much as possible. However, in the stepwise film forming apparatus that intermittently conveys the flexible substrate 1, the conveying resistance Qx exerted in both normal and reverse directions may desirably serve as a force maintaining the flexible substrate 1 to be stabilized at the stop position.

(Second Embodiment)

Figure 8:
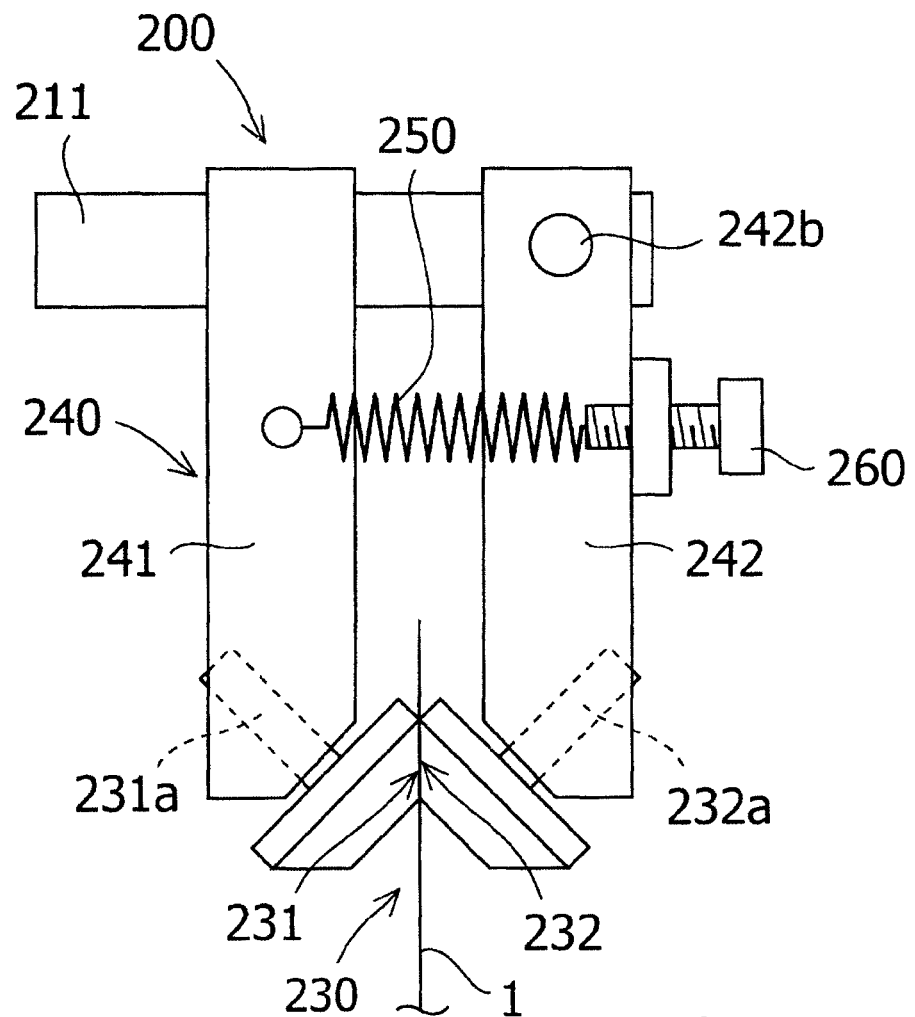
FIG. 8 is a front view illustrating a position controller for substrate according to a second embodiment of the invention.

FIG. 8 is a front view illustrating a position controller for substrate 200 according to a second embodiment of the invention when seen from the upstream in the conveying direction. In the position controller for substrate 200, sandwiching rollers 231 and 232 constituting a pair of sandwiching rollers 230 are all formed as truncated conical rollers. That is, in the sandwiching rollers 231 and 232 of the second embodiment, the shape of the large diameter side is the same as that of the sandwiching rollers 131 and 132 of the first embodiment, but the small diameter side is shortened. Since the other configurations are the same as those of the first embodiment, the same reference numerals are given thereto, and the specific description thereof will not be repeated. FIGS. 9A to 9C respectively correspond to FIGS. 3A to 3C.

In each of the sandwiching rollers 231 and 232 shown in the example shown in the drawing, the ratio of the width of the contact portion with respect to the entire conical contact portion shown in FIG. 11A: $W/W_{max}$ is 50%. Even in each of the sandwiching rollers 231 and 232 of the second embodiment, the stretching action with respect to the flexible substrate 1 is basically the same, but the conveying resistance Qx may be easily decreased.

When comparing FIG. 9C illustrating the action of the sandwiching roller 231 (232) according to the second embodiment with FIG. 3C illustrating the action of the sandwiching roller 131 (132) of the first embodiment, the shape of the large diameter side is the same. Accordingly, the movement orbits of the substantial sandwiching points L1 and L2 are the same, whereby the tensile force Qy with respect to the flexible substrate 1 is basically the same. However, in the sandwiching roller 231 (232) according to the second embodiment, the sliding action (S0-S1) at the small diameter side decreases and the conveying resistance Qx largely decreases in accordance with a decrease of a difference in circumferential length between the large diameter side and the small diameter side.

FIG. 11 illustrates a relation between the width W (the ratio of the width of the contact portion with respect to the width of the entire conical contact portion: $W/W_{max}$) of the contact portion, the tensile force Qy, the conveying resistance Qx when the inclination angle of the contact portion of the sandwiching roller is constant. In FIG. 11B, when W is equal to $W_{max}$, that is, the entire conical shape is provided instead of the truncated conical shape, $W/W_{max}$ is 100%, and W decreases and the value of $W/W_{max}$ decreases in accordance with the truncated degree.

The relation between the width W of the contact portion depicted by the dashed line in the drawing and the conveying resistance Qx is described above. When the value of the conveying resistance Qx is used as a reference when W is equal to $W_{max}$ ($W/W_{max}$=100%), the conveying resistance Qx decreases by 0.7 times (reduced by 30%) in the case of $W/W_{max}$=60%, and the conveying resistance Qx decreases by 0.5 times (reduced by 50%) compared to $W/W_{max}$=100% in the case of $W/W_{max}$=30%. That is, the conveying resistance Qx largely decreases when the width W of the contact portion decreases.

On the other hand, regarding the tensile force Qy, a tendency is found in which the tensile force Qy increases as the width W of the contact portion between the sandwiching rollers 231 and 232 and the flexible substrate 1 is shortened due to an increase in pressure at the sandwiching surface. When the value of the tensile force Qy is used as a reference when W is equal to $W_{max}$ ($W/W_{max}$=100%), the tensile force Qy slightly increases by 1.04 times (increased by 4%) in the case of $W/W_{max}$=60%, and the tensile force Qy abruptly increases by 1.71 times (increased by 71%) compared to $W/W_{max}$=100% in the case of $W/W_{max}$=30%. The tensile force Qy remarkably increases around the position where the line indicating the tensile force Qy and the line indicating the conveying resistance Qx intersect each other and a decreasing amount in the ratio of the width of the contact portion with respect to the width of the entire conical contact portion: $W/W_{max}$ becomes more than 60%. However, since the control width of controlling the tensile force Qy also decreases when the width W of the contact portion is extremely narrow, it is desirable that the width W of the contact portion be from 30% to 60% of the width $W_{max}$ of the entire conical contact portion.

Figure 12A:
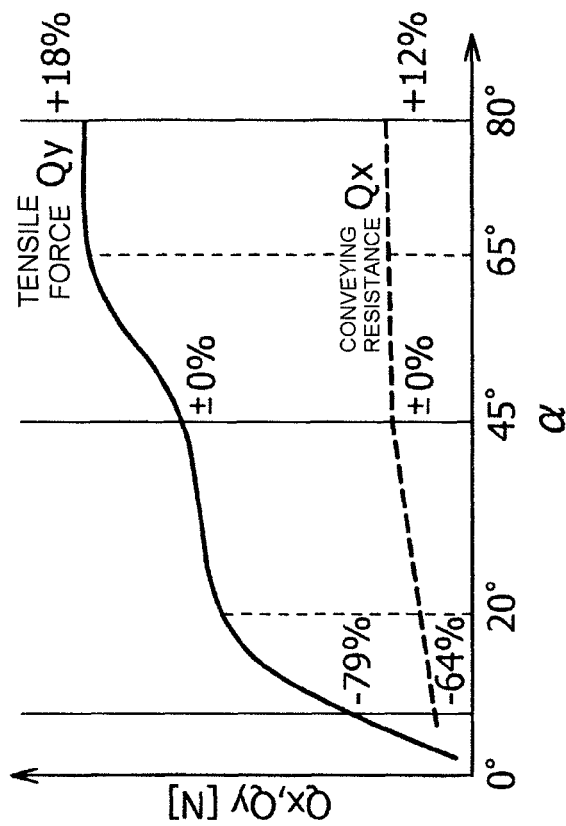
FIG. 12 is a diagram illustrating a relation among an inclination angle of the contact portion of the sandwiching roller, a tensile force, and a conveying resistance.
Figure 12B:
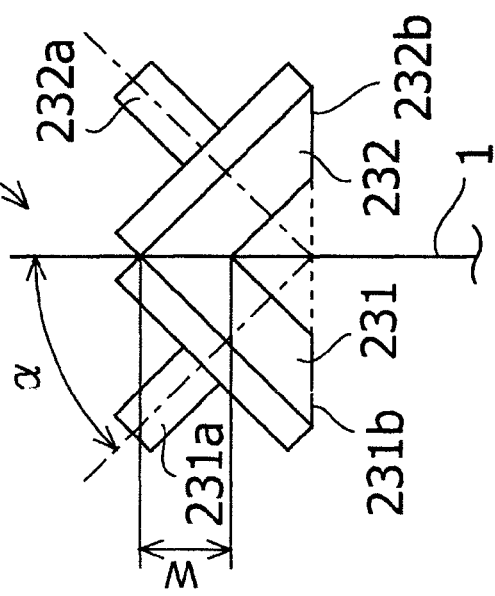

FIG. 12 illustrates a relation between the contact inclination angle α, the tensile force Qy, and the conveying resistance Qx when the width W of the contact portion of the sandwiching roller is constant, and the tensile force Qy and the conveying resistance Qx are shown as the ratio (%) with respect to the case where the contact inclination angle α=45°. As shown in FIG. 12, the tensile force Qy may be increased by increasing the contact inclination angle α, but when the contact inclination angle becomes more than the contact inclination angle α=65°, the tensile force Qy does not increase. When the contact inclination angle is larger than the contact inclination angle α=80°, it is difficult to form the device. Further, when the contact inclination angle α is decreased to be less than α=20°, the tensile force Qy abruptly decreases. On the other hand, the conveying resistance Qx also increases with an increase in the tensile force Qy in all ranges of the contact inclination angle α, but when the contact inclination angle is the contact inclination angle α=45° or more, the conveying resistance Qx very slightly increases. Therefore, when the large tensile force Qy with respect to the pressing force Px is needed, it is desirable that the contact inclination angle is the contact inclination angle α=45~65°.

Figure 13:
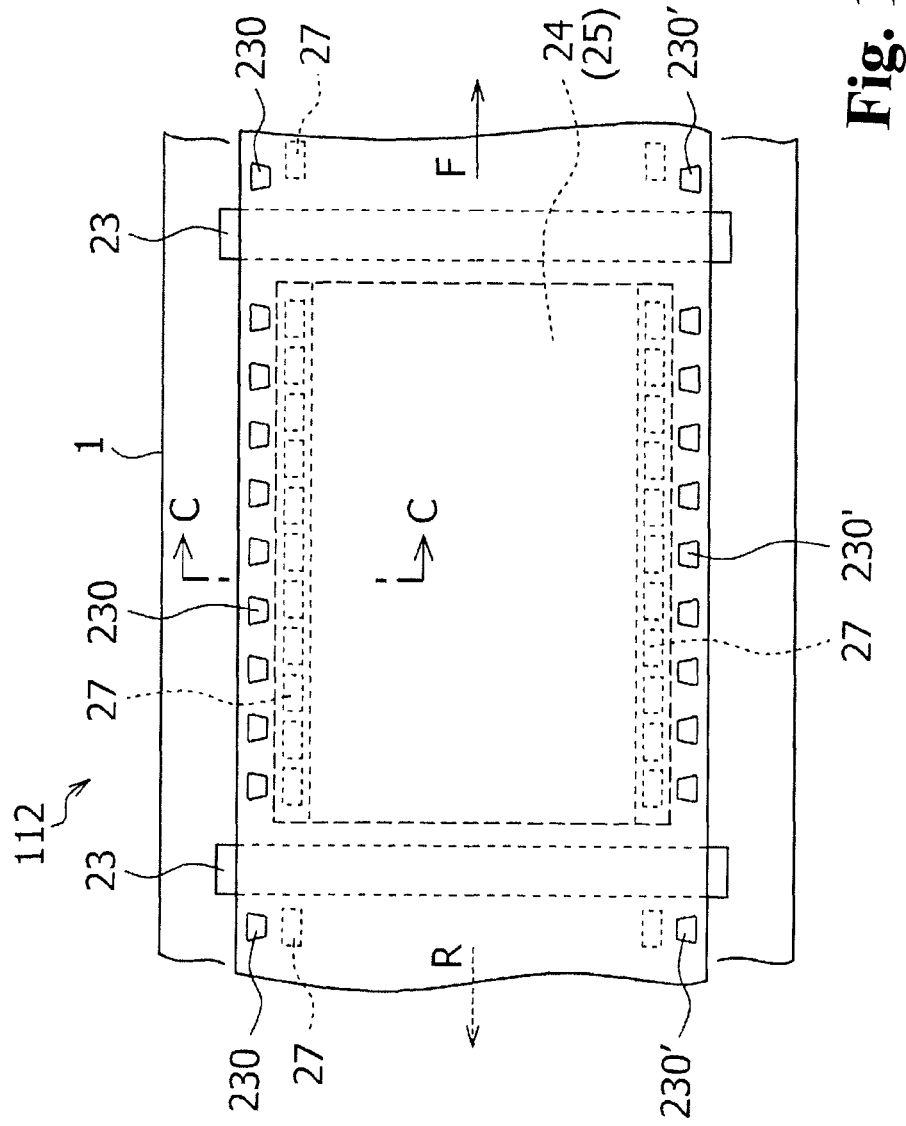
FIG. 13 is a schematic side view illustrating one film forming unit of a continuous film forming type manufacturing apparatus including the position controller for substrate according to the second embodiment of the invention.
Figure 14:
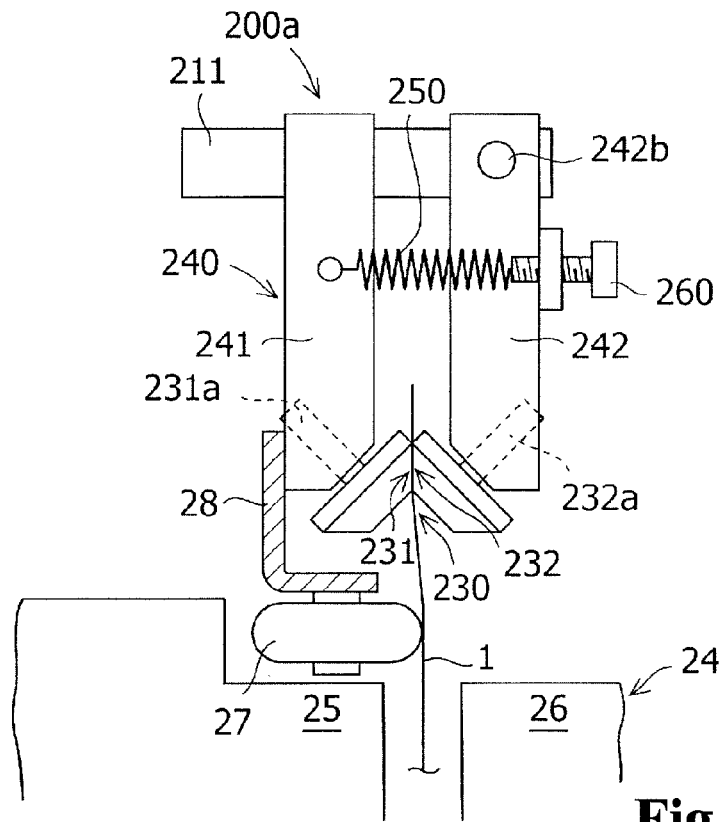
FIG. 14 is a cross-sectional view taken along the line C-C of FIG. 13.

Next, FIGS. 13 and 14 illustrate embodiments in which a position controller for substrate 200a is configured by applying the position controller for substrate 200 of the second embodiment to a continuous film forming type thin film laminated body manufacturing apparatus 112. In each film forming portion 24 of the continuous film forming type manufacturing apparatus 112, an electrode 25 (target) and a ground electrode 26 having a heater embedded therein are disposed to face each other with the flexible substrate 1 interposed therebetween. However, the electrode 25 and the ground electrode 26 are fixed to the flexible substrate 1 with a predetermined gap, and continuously form a film in a non-contact state. For this reason, the film forming region on the flexible substrate 1 is not segmented by the conveying direction, and rolls 23 and 23 are disposed at the upstream and the downstream in the conveying direction of the film forming portion 24 so as to guide the flexible substrate 1.

Therefore, the continuous film forming type manufacturing apparatus 112 is mainly used to stretch the flexible substrate in the lateral direction so as to suppress wrinkles generated in the flexible substrate 1 due to a tensile force and heat rather than the drooping of the flexible substrate 1 due to the gravity thereof. Then, as shown in the drawings, plural pairs of upper and lower sandwiching rollers 230 and 230' are arranged in series at the upper and lower portions of the film forming portion 24.

Further, in the continuous film forming type manufacturing apparatus 112, the periphery of the electrode 25 increases to about 300° C. due to the heat radiated from the heater. Therefore, in consideration of the heat radiated to the pair of sandwiching rollers 230 and 230', a plurality of support rollers 27 are disposed in series along the conveying direction between the electrode 25 and the pair of upper and lower sandwiching rollers 230 and 230', and each pair of sandwiching rollers 230 and 230' is disposed outside the electrode 25. Each support roller 27 is desirably formed as a metallic roller with satisfactory heat resistance, and is rotatably supported to a shaft protruding from the lower surface of the bracket 28. In the example shown in the drawing, the bracket 28 is fixed to a fixed support member 241, but may be fixed to the electrode 25.

In the above-described embodiments, a case has been described in which the position controller for substrate according to the invention is applied to the thin film laminated body manufacturing apparatus forming a film while conveying the flexible substrate 1 in the lateral direction in the longitudinal position. However, the position controller for substrate according to the invention may be applied to various processing apparatuses or manufacturing apparatuses forming a film while conveying the flexible substrate 1 in the lateral position (horizontal position) in the horizontal direction, the vertical direction, or the inclined direction.

(Third Embodiment)

Figure 15:
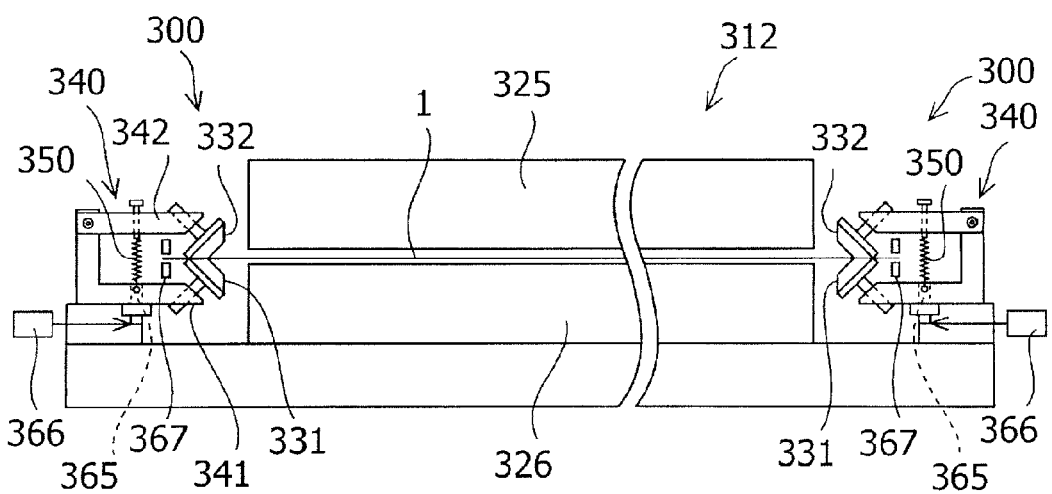
FIG. 15 is a schematic cross-sectional view illustrating another continuous film forming type manufacturing apparatus including a position controller for substrate according to a third embodiment of the invention.

FIG. 15 is a cross-sectional view illustrating an embodiment in which a position controller for substrate 300 which is the same as that of the second embodiment of the invention is applied to a continuous film forming type manufacturing apparatus 312 conveying a substrate in a lateral position when seen from the upstream in the conveying direction. In the thin film laminated body manufacturing apparatus 312, a film forming unit including an electrode 325 (target) and a ground electrode 326 disposed at the upper and lower sides to face each other with the flexible substrate 1 interposed therebetween is disposed inside a vacuum chamber maintained at a constant vacuum degree. Guide rolls (idle rolls), feeding rolls, tension rolls, or the like constituting a conveying unit are disposed at the upstream and the downstream in the conveying direction of the film forming unit, and an unwinding roll and a winding roll of the flexible substrate 1 are disposed at the upstream and the downstream in the conveying direction. Since this configuration is the same as that of the related art, the configuration is not shown.

In FIG. 15, the position controller for substrate of the thin film laminated body manufacturing apparatus 312 includes two position controller for substrates 300 and 300 that are disposed in the lateral direction at both sides in the conveying path of the flexible substrate 1. Since two position controller for substrates 300 and 300 basically have the same structure as that of the position controller for substrate 200 of the second embodiment except that a fixed sandwiching roller 331 (a fixed support member 341) is disposed at the lower side in the lateral direction, any side is provided with an actuator 366 and a sensor 367, a pressing force is actively controlled by a spring 350, and a movable support member 342 is swingably connected to a fixed support member 341 serving as a bracket, the same reference numerals are given to the same components, and the components will not be specifically described.

In the manufacturing apparatus 312, the ground electrode 326 is disposed at the lower surface side of the flexible substrate 1, and the influence of the gravity of the flexible substrate 1 is small and is the same at each of the position controller for substrates 300 and 300. Therefore, the control amount of the actuator 366 and the initial displacement of the spring 350 and 350 are set to be basically the same in the position controller for substrates 300 and 300.

On the other hand, the control of the pressing force using each actuator 366 is performed in an individual manner or an interlocked manner on the basis of the detection of each sensor 367 in order to correct the displacement or the meandering of the flexible substrate 1 in the lateral direction while stretching the flexible substrate 1 in the lateral direction. Therefore, each sensor 367 may include two detectors disposed adjacent to each other in the lateral direction to correspond to the maximal value and the minimal value allowed for each edge position of the flexible substrate 1, or each sensor 367 may be configured as one image sensor to detect each edge position of flexible substrate 1 by image processing.

While the embodiments of the invention have been described, the invention is not limited to the above-described embodiments, and various modifications and changes may be made on the basis of the technical spirit of the invention.

For example, in the above-described embodiments, a case has been described in which a stretching spring is used as an urging device, but may be configured as a compressing spring by appropriately changing the connection point with respect to the fixed and movable support members, each link, and the movable shaft. In this case, an arm portion or the like may be additionally provided in each of the fixed or movable support member, each link, or the movable shaft if necessary. Further, the coil spring may be changed as various general springs such as a spiral spring, a torsion spring, and a leaf spring. The fixed and movable support members and the links may move close to or away from each other by a linear sliding movement, but the swinging movement (pivoting movement) is desirable from the viewpoint of efficiency.

Further, in the above-described embodiments, a case has been described in which the position controller for substrate according to the invention is applied to the thin film laminated body manufacturing apparatus for the solar cell. However, the position controller for substrate of the invention may be, of course, applied to an apparatus that manufactures a semiconductor thin film such as an organic EL, and various processing apparatuses related to coating, cleaning, drying, heat-treatment, surface processing, and the like that require the positional control or the stretching operation of the flexible substrate in addition to film forming.

EXPLANATIONS OF LETTERS OR NUMERALS

1: FLEXIBLE SUBSTRATE
10: VACUUM CHAMBER
11: STRUCTURE COMPONENT
20: FILM FORMING UNIT
21, 25, 325: ELECTRODE
22, 26, 326: GROUND ELECTRODE
24: FILM FORMING PORTION
27: SUPPORT ROLLER
100, 200, 300: POSITION CONTROLLER FOR SUBSTRATE
111, 211: BRACKET
130, 230, 330: PAIR OF SANDWICHING ROLLERS
131, 231, 331: FIXED ROLLER
132, 232, 332: MOVABLE ROLLER
140, 240, 340: SUPPORTING MECHANISM
141, 241, 341: FIXED SUPPORT MEMBER
142, 242, 342: MOVABLE SUPPORT MEMBER
142b, 242b: HINGE
150, 250, 350: SPRING (URGING DEVICE)
160, 260, 360: PRESSING FORCE ADJUSTING SCREW
365: MOVABLE SHAFT
366: ACTUATOR
367: SENSOR

What is claimed is:

1. A position controller for flexible substrate, provided in a processing apparatus conveying a band-shaped flexible substrate in a longitudinal position, in a lateral direction and processing the substrate in a processing unit installed on a conveying path of the substrate, the position controller for flexible substrate comprising:
   a pair of sandwiching rollers sandwiching an upper edge of the substrate;
   a supporting mechanism supporting rotatably and capable of moving the pair of sandwiching rollers close to or away from each other;
   an urging device urging a pressing force to the pair of sandwiching rollers through the supporting mechanism; and
   a pressing force adjusting device adjusting the pressing force from the urging device,
   wherein each roller constituting the pair of sandwiching rollers is a conical roller having a circumferential surface inclined with respect to an axial direction, and is supported by the supporting mechanism such that a small diameter side of each conical roller is disposed at a center side of the substrate in the lateral direction and a rotation direction of a sandwiching surface of the substrate is directed in a same direction as a conveying direction of the substrate, and
   the pair of conical rollers is disposed so that the inclined circumferential surfaces thereof face each other to sandwich the upper edge of the substrate and convey in the conveying direction.

2. A position controller for flexible substrate according to claim 1, wherein each roller constituting the pair of sandwiching rollers is a truncated conical roller.

3. A position controller for flexible substrate according to claim 2, wherein an inclination angle of the circumferential surface of each conical roller with respect to a rotation shaft is set to be from 20° to 80°.

4. A position controller for flexible substrate according to claim 2, wherein an inclination angle of the circumferential surface of each conical roller with respect to a rotation shaft is set to be from 45° to 65°.

5. A position controller for flexible substrate according to claim 1, further comprising:
   a pair of lower sandwiching rollers sandwiching a lower edge of the substrate; and
   a supporting mechanism and an urging device for the pair of lower sandwiching rollers, having a same configuration as said supporting mechanism and said urging device.

6. A position controller for flexible substrate according to claim 5, wherein the processing apparatus is a thin film laminated body manufacturing apparatus including a plurality of film forming portions serving as the processing unit and disposed in parallel at a same pitch in the conveying path of the substrate and sequentially laminating thin films on the surface of the substrate while intermittently conveying the substrate at the pitch corresponding to the film forming portions, and
   the pair of upper sandwiching rollers and the pair of lower sandwiching rollers are disposed between the plurality of film forming portions.

7. A position controller for flexible substrate according to claim 5, wherein the processing apparatus is a thin film laminated body manufacturing apparatus continuously conveying the substrate and laminating thin films on the surface of the substrate in a film forming portion as the processing unit, and
   the plurality of pairs of upper sandwiching rollers and the plurality of pairs of lower sandwiching rollers are disposed at the upper and lower sides of the film forming portion in the conveying direction.

8. A position controller for flexible substrate according to claim 7, further comprising a plurality of support rollers to support the substrate, disposed in series in the conveying direction between a thin film forming region of the substrate and the plurality of pairs of upper sandwiching rollers and between the thin film forming region and the plurality of pairs of lower sandwiching rollers.

9. A position controller for flexible substrate, provided in a processing apparatus conveying a band-shaped flexible substrate and processing the substrate in a processing unit installed on a conveying path of the substrate, the position controller for flexible substrate comprising:
   pairs of sandwiching rollers, each sandwiching each edge of the substrate;
   supporting mechanisms, each supporting rotatably and capable of moving each pair of sandwiching rollers close to or away from each other;
   urging devices, each urging a pressing force to each pair of sandwiching rollers through each supporting mechanism; and
   pressing force adjusting devices, each adjusting the pressing force from the urging device,
   wherein each roller constituting each pair of sandwiching rollers is a conical roller having a circumferential surface inclined with respect to the axial direction, and is supported by each supporting mechanism such that a small diameter side of each conical roller is disposed at a center side of the substrate in the lateral direction and the rotation direction of a sandwiching surface of the substrate is directed in a same direction as the conveying direction of the substrate, and
   each of the pair of conical rollers is disposed so that the inclined circumferential surfaces thereof face each other to sandwich the edges of the substrate and convey in the conveying direction.

10. A position controller for flexible substrate according to claim 1, wherein the inclined circumferential surfaces of the pair of conical rollers face in parallel to each other with respect to the sandwiching surface of the substrate.

11. A position controller for flexible substrate according to claim 1, further comprising a shaft rotatably supported at an angle at a front end of the supporting mechanism to rotate each of the pair of conical rollers.

12. A position controller for flexible substrate according to claim 1, wherein parts of the inclined circumferential surfaces facing each other are oriented vertically, and are arranged to sandwich and convey the substrate.

13. A position controller for flexible substrate according to claim 9, wherein parts of the inclined circumferential surfaces facing each other are oriented vertically, and are arranged to sandwich and convey the substrate.

* * * * *

UNITED STATES PATENT AND TRADEMARK OFFICE
CERTIFICATE OF CORRECTION

PATENT NO. : 8,746,309 B2
APPLICATION NO. : 13/381051
DATED : June 10, 2014
INVENTOR(S) : Takanori Yamada and Shoji Yokyama It is certified that error appears in the above-identified patent and that said Letters Patent is hereby corrected as shown below:

In SPECIFICATION,

Please change column 12, line 67, "300 C." to --300 C--.

Signed and Sealed this
Thirteenth Day of January, 2015

Michelle K. Lee
*Deputy Director of the United States Patent and Trademark Office*